US010777258B1

(12) United States Patent
Won et al.

(10) Patent No.: US 10,777,258 B1
(45) Date of Patent: Sep. 15, 2020

(54) SEMICONDUCTOR DEVICE

(71) Applicant: SK hynix Inc., Icheon-si Gyeonggi-do (KR)

(72) Inventors: Hyung Sik Won, Cheongju-si (KR); Jae Jin Lee, Gwangju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/879,248

(22) Filed: May 20, 2020

Related U.S. Application Data

(62) Division of application No. 16/294,655, filed on Mar. 6, 2019, now Pat. No. 10,699,773, which is a division of application No. 15/701,754, filed on Sep. 12, 2017, now Pat. No. 10,269,410.

(30) Foreign Application Priority Data

Feb. 15, 2017 (KR) .................. 10-2017-0020629

(51) Int. Cl.
| | |
|---|---|
| *G11C 8/00* | (2006.01) |
| *G11C 11/4094* | (2006.01) |
| *G11C 11/4074* | (2006.01) |
| *G11C 7/08* | (2006.01) |
| *G11C 11/4091* | (2006.01) |
| *G11C 11/4097* | (2006.01) |
| *G11C 11/404* | (2006.01) |
| *G11C 5/14* | (2006.01) |
| *G11C 11/408* | (2006.01) |

(52) U.S. Cl.
CPC .......... *G11C 11/4094* (2013.01); *G11C 7/08* (2013.01); *G11C 11/4074* (2013.01); *G11C 11/4091* (2013.01); *G11C 11/4097* (2013.01); *G11C 5/147* (2013.01); *G11C 11/404* (2013.01); *G11C 11/4087* (2013.01); *G11C 2207/002* (2013.01); *G11C 2207/005* (2013.01)

(58) Field of Classification Search
CPC ....................................................... G11C 8/12
USPC .................................................... 365/230.03
See application file for complete search history.

(56) References Cited

U.S. PATENT DOCUMENTS

| | | | |
|---|---|---|---|
| 9,431,071 B2 | 1/2016 | Moon et al. | |
| 10,269,410 B2 * | 4/2019 | Won | ..... G11C 11/4094 |
| 2009/0129135 A1 | 5/2009 | Choi | |

(Continued)

FOREIGN PATENT DOCUMENTS

KR    1020090121474 A    11/2009

*Primary Examiner* — Hoai V Ho
(74) *Attorney, Agent, or Firm* — William Park & Associates Ltd.

(57) ABSTRACT

A semiconductor device is disclosed, which relates to a technology for a sense-amplifier (sense-amp) configured to compensate for mismatch of a sensing bit-line. The semiconductor device includes a sense-amplifier configured to selectively control connection between a pair of bit lines and a pair of sensing bit lines in response to a connection control signal in an offset compensation period, and precharge a pull-down power-supply line with a bit line precharge voltage level in the offset compensation period. The semiconductor device also includes a pull-down voltage controller configured to increase a voltage of the pull-down power-supply line by a predetermined level in response to a pull-down control signal in the offset compensation period.

8 Claims, 17 Drawing Sheets

(56) References Cited

U.S. PATENT DOCUMENTS

2009/0135639 A1   5/2009   Hirose
2012/0188836 A1   7/2012   Lee et al.

\* cited by examiner

SEMICONDUCTOR DEVICE

CROSS-REFERENCE TO RELATED APPLICATION

This application is a divisional application of U.S. patent application of U.S. patent application Ser. No. 16/294,655, file on Mar. 6, 2019, which is a divisional application of U.S. patent application Ser. No. 15/701,754, filed on Sep. 12, 2017, and claims priority based upon Korean patent application No. 10-2017-0020629, filed on Feb. 15, 2017, the disclosure of which is hereby incorporated by reference in its entirety herein.

BACKGROUND OF THE INVENTION

1. Technical Field

Embodiments of the present disclosure may generally relate to a semiconductor device, and more particularly to a technology for a sense-amplifier (sense-amp) configured to compensate for mismatch of a sensing bit-line.

2. Background Art

With the increasing integration degree of semiconductor memory devices, semiconductor memory devices have also been continuously improved to increase the operation speed. In order to increase operation speeds of semiconductor memory devices, synchronous memory devices capable of operating by synchronizing with an external clock of a memory chip have been recently proposed and developed.

A Dynamic Random Access Memory (DRAM) from among semiconductor memory devices is a representative volatile memory. A memory cell of the DRAM is comprised of a cell transistor and a cell capacitor.

In this case, the cell transistor controls accessing the cell capacitor, and the cell capacitor stores electric charges corresponding to data. That is, the stored data is classified into high-level data and low-level data according to the amount of electric charges stored in the cell capacitor.

Because electric charges are applied or leaked to the cell capacitor of the memory cell of the DRAM by a leakage component, the corresponding data should be periodically stored again in the cell capacitor. As described above, the above periodic storing operation for correctly maintaining desired data is referred to as a refresh operation.

A memory cell of the DRAM is activated in an active mode. A bit-line sense-amplifier (sense-amp) circuit is configured to sense/amplify data received from the activated memory cell, and re-transmits the amplified data to a memory cell.

BRIEF SUMMARY OF THE INVENTION

Various embodiments of the present disclosure are directed to providing a semiconductor device that substantially obviates one or more problems due to limitations and disadvantages of the related art.

The embodiment of the present disclosure relates to a technology for stabilizing a bit-line precharge voltage by adjusting a level of a pull-down power-supply line prior to operation of a sense-amplifier, resulting in reduction of a chip size of a semiconductor device.

In accordance with an embodiment of the present disclosure, a semiconductor device includes: a sense-amplifier configured to selectively control a connection between a pair of bit lines and a pair of sensing bit lines in response to a connection control signal within an offset compensation period, and precharge a pull-down power-supply line with a bit line precharge voltage level in the offset compensation period; and a pull-down voltage controller configured to increase a voltage of the pull-down power-supply line by a predetermined level in response to a pull-down control signal in the offset compensation period.

In accordance with another embodiment of the present disclosure, a semiconductor device includes: a plurality of sense-amplifiers configured to perform a sensing operation of a pair of sensing bit lines if a pair of bit lines is separated from the pair of sensing bit lines within a pre-sensing period; a plurality of mats, each of which includes a plurality of local bit lines and a plurality of global bit lines, wherein some parts of the plurality of local bit lines are coupled to the plurality of sense-amplifiers through the plurality of global bit lines; and a switching circuit configured to control connection of the plurality of sense-amplifiers, the plurality of local bit lines, and the plurality of global bit lines in response to a switching signal.

In accordance with another embodiment of the present disclosure, a semiconductor device includes: a plurality of mats, each of which includes a plurality of local bit lines and a plurality of global bit lines; a plurality of sense-amplifiers located in both edge regions of the plurality of mats; a plurality of switching circuits located in gap regions interposed between the plurality of mats, and configured to selectively interconnect the plurality of global bit lines in response to a row address having mat selection information; a plurality of switching groups located to correspond to the plurality of mats, and configured to selectively control connection of the plurality of local bit lines and the plurality of global bit lines; and a loading circuit located in both edge regions of the plurality of mats, and configured to correct loading of a contiguous sense-amplifier.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions.

Figure 1:
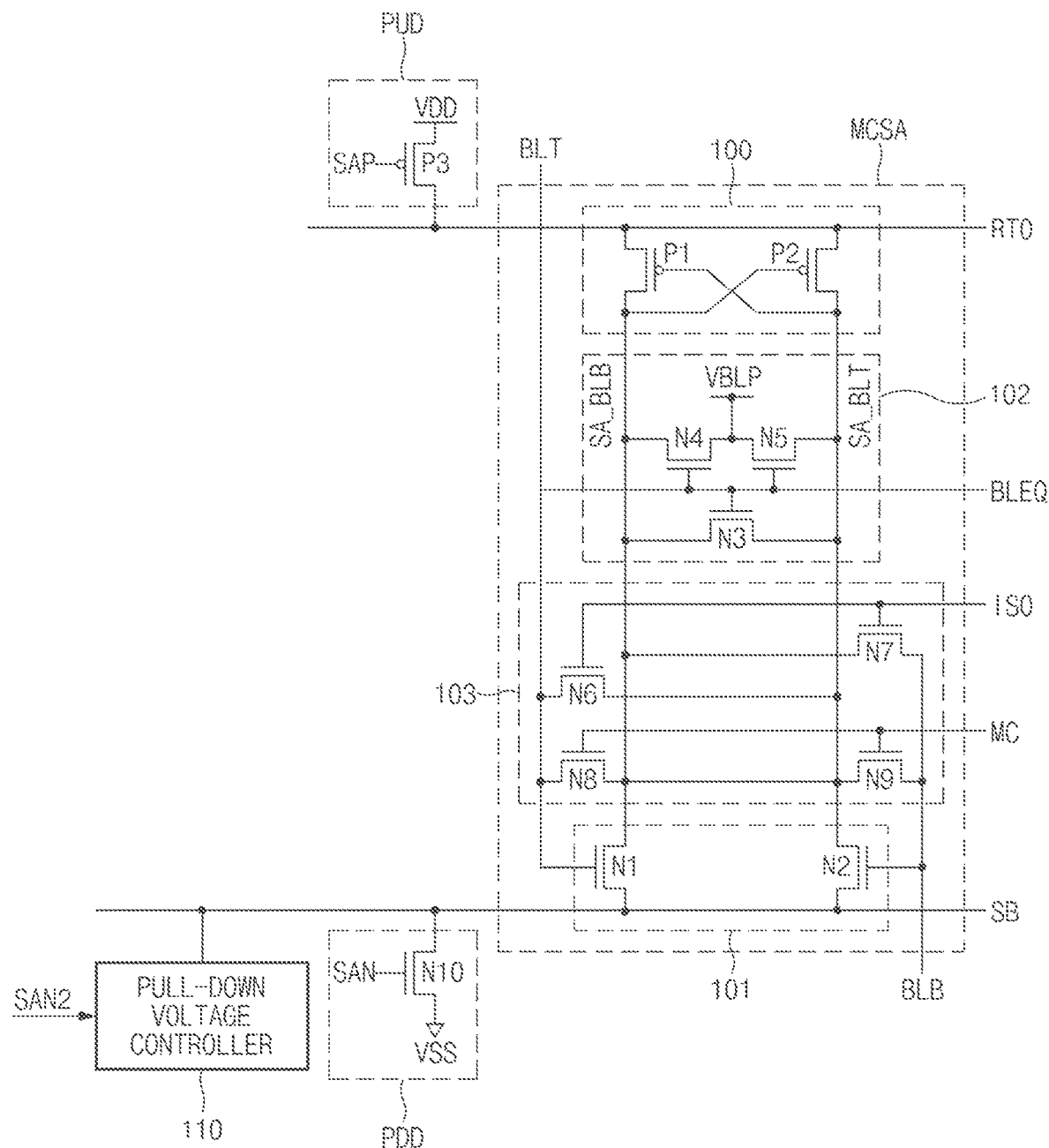
FIG. 1 is a block diagram illustrating a representation of an example of a semiconductor device according to an embodiment of the present disclosure.

FIG. 1 is a block diagram illustrating a representation of an example of a semiconductor device according to an embodiment of the present disclosure.

Data stored in the data output buffer according to an embodiment of the present disclosure may be classified into a high level H and a low level L in response to a voltage level, and the high-level data and the low-level data may be denoted by "1" and "0", respectively. In this case, such data values may be differentially classified into different values according to a voltage level and a current magnitude. In the case of binary data, a high level may be defined as a high voltage, and a low level may be defined as a voltage lower than the high level. In addition, the NMOS transistor may be represented by a pull-down drive element, and the PMOS transistor may be represented by a pull-up drive element.

Referring to FIG. 1, the semiconductor device according to an embodiment of the present disclosure includes a sense-amplifier MCSA, a pull-up driver PUD, a pull-down driver PDD, and a pull-down voltage controller 110. In this case, the sense-amplifier MCSA may be comprised of a mismatch compensation sense amplifier.

As semiconductor devices progress and the degree of technology shrinks, there tends to be an increase in the amount of offset of the sense-amplifier MCSA. The mismatch compensation sense-amplifier (MCSA) structure may compensate for the amount of offset between latch transistors.

The sense-amplifier MCSA may include a pull-up circuit 100, a pull-down circuit 101, a precharge circuit 102, and a connection controller 103.

The pull-up driver 100 may include PMOS transistors P1 and P2. The PMOS transistors P1 and P2 may be coupled between a pull-up power-supply line RTO and the pair of sensing bit lines SA_BLT and SA_BLB, such that gate terminals of the PMOS transistors P1 and P2 are cross-coupled to each other. The pull-down circuit 101 may include NMOS transistors N1 and N2. The NMOS transistors N1 and N2 may be coupled between the pull-down power-supply line SB and the pair of sensing bit lines SA_BLT and SA_BLB, and gate terminals of the NMOS transistors N1 and N2 are coupled to the pair of bit lines BLT and BLB. The pull-up circuit 100 and the pull-down circuit 101 may be configured in the form of a latch structure, and may sense and amplify data of the pair of sensing bit lines SA_BLT and SA_BLB.

The precharge circuit 102 may include a plurality of NMOS transistors N3~N5. The NMOS transistor N3 may be coupled between the pair of sensing bit lines SA_BLT and SA_BLB. The NMOS transistors N4 and N5 may be coupled in series between the sensing bit lines SA_BLT and SA_BLB. The plurality of NMOS transistors N3~N5 may receive an equalization signal BLEQ through a common gate terminal.

Because the NMOS transistors N3~N5 are turned on during activation of an equalization signal BLEQ, the precharge circuit 102 may precharge the pair of sensing bit lines SA_BLT and SA_BLB with a bit-line precharge voltage (VBLP) level. In this case, the bit-line precharge voltage VBLP may be half a power-supply voltage (or core voltage) VDD level. That is, the bit-line precharge voltage VBLP may be represented by ½ VDD level.

During the sensing operation, the sense-amplifier MCSA may disconnect the pair of bit lines BLT and BLB from the pair of bit lines SA_BLT and SA_BLB based on operation of the connection controller 103. The connection controller 103 may include a plurality of NMOS transistors N6~N9. In this case, the NMOS transistors N6 and N7 may be switched by a connection control signal ISO, and may selectively control connection between the pair of bit lines BLT and BLB and the pair of sensing bit lines SA_BLT and SA_BLB. The NMOS transistors N8 and N9 may be switched by a connection control signal MC, and may selectively control connection between the pair of bit lines BLT and BLB and the pair of sensing bit lines SA_BLT and SA_BLB.

When the connection control signal ISO is activated, the bit line BLT may be coupled to the sensing bit line SA_BLT, and the bit line bar BLB may be coupled to the sensing bit line bar SA_BLB. In contrast, when the connection control signal ISO is deactivated, connection between the bit line BLT and the sensing bit line may be severed, and connection between the bit line bar BLB and the sensing bit line bar SA_BLB may be severed.

When the connection control signal MC is activated, the bit line BLT may be coupled to the sensing bit line bar SA_BLB, and the bit line bar BLB may be coupled to the sensing bit line SA_BLT. In contrast, when the connection control signal MC is deactivated, connection between the bit line BLT and the sensing bit line bar SA_BLB may be severed, and connection between the bit line bar BLB and the sensing bit line SA_BLT may be severed.

The connection controller 103 may selectively sever a connection between the pair of bit lines BLT and BLB and the pair of sensing bit lines SA_BLT and SA_BLB according to the connection control signals MC and ISO. Therefore, the connection controller 103 may isolate a first operation of the pair of bit lines BLT and BLB from a second operation of the pair of sensing bit lines SA_BLT and SA_BLB, such that the connection controller 103 may perform the first operation and the second operation separately from each other. Prior to execution of the sensing operation, the connection controller 103 may selectively control connection between the pair of bit lines BLT and BLB and the pair of sensing bit lines SA_BLT and SA_BLB, such that the connection controller 103 may compensate for a mismatch of latch transistors contained in the pull-up circuit 100 and the pull-down circuit 101.

The pull-up driver PUD may pull up the pull-up power-supply line RTO to a power-supply voltage (VDD) level in response to a pull-up drive signal SAP. The pull-up driver PUD may include a PMOS transistor P3 that is coupled between the power-supply voltage (VDD) input terminal and the pull-up power-supply line RTO and receives a pull-up drive signal SAP through a gate terminal.

The pull-down driver PDD may pull down the pull-down power-supply line SB to a ground voltage (VSS) level in response to a pull-down drive signal SAN. The pull-down driver PDD may include an NMOS transistor N10 that is coupled between a pull-down power-supply line SB and a ground voltage (VSS) input terminal and receives the pull-down drive signal SAN through a gate terminal. In this case, the pull-down drive signal SAN may be activated during a predetermined time period according to a control signal such as an active signal, a precharge signal, or the like.

In this case, each of the pull-up drive signal SAP and the pull-down drive signal SAN may be activated during a predetermined time period according to a control signal such as an active signal, a precharge signal, or the like. The active signal may be activated after a predetermined time starting from a reception time of an active command, and the precharge signal may be activated after a predetermined time starting from a reception time of a precharge command.

The pull-down voltage controller 110 may operate in an offset compensation period prior to operation of the sense-amplifier MCSA. For example, the sense-amplifier MCSA may selectively control a connection between the pair of bit lines BLT and BLB and the pair of sensing bit lines SA_BLT and SA_BLB in response to at least one connection control signal MC or ISO within the offset compensation period. The offset compensation period may refer to a predetermined period in which the pair of sensing bit lines SA_BLT and SA_BLB are precharged to compensate for the offset caused by mismatch of the pair of bit lines BLT and BLB prior to activation of word line(s). During the offset compensation period, the pair of sensing bit lines SA_BLT and SA_BLB may be maintained at the bit line precharge voltage (VBLP) level.

However, during the offset compensation period, the bit line precharge voltage VBLP may not maintain a normal level due to a threshold voltage and a resistance value of a latch transistor contained in the sense-amplifier MCSA, resulting in reduction of the bit line precharge voltage (VBLP) level. In this case, power consumption of the sense-amplifier MCSA may be increased, and an offset margin between data "0" and data "1" may deteriorate.

Therefore, during the offset compensation period prior to the sensing period of the sense-amplifier MCSA, the pull-down voltage controller 110 according to the embodiment of the present disclosure may increase a voltage level of the pull-down power-supply line SB by a predetermined level in response to a pull-down control signal SAN2. Further, the sense-amplifier MCSA may precharge the pull-down power-supply line SB with a bit line precharge voltage VBLP in the offset compensation period. As a result, a voltage level of the pull-down power-supply line SB may increase prior to the sensing operation of the sense-amplifier MCSA, and thus may compensate for the bit line precharge voltage (VBLP) level to be lowered than a predetermined voltage.

Figure 2:
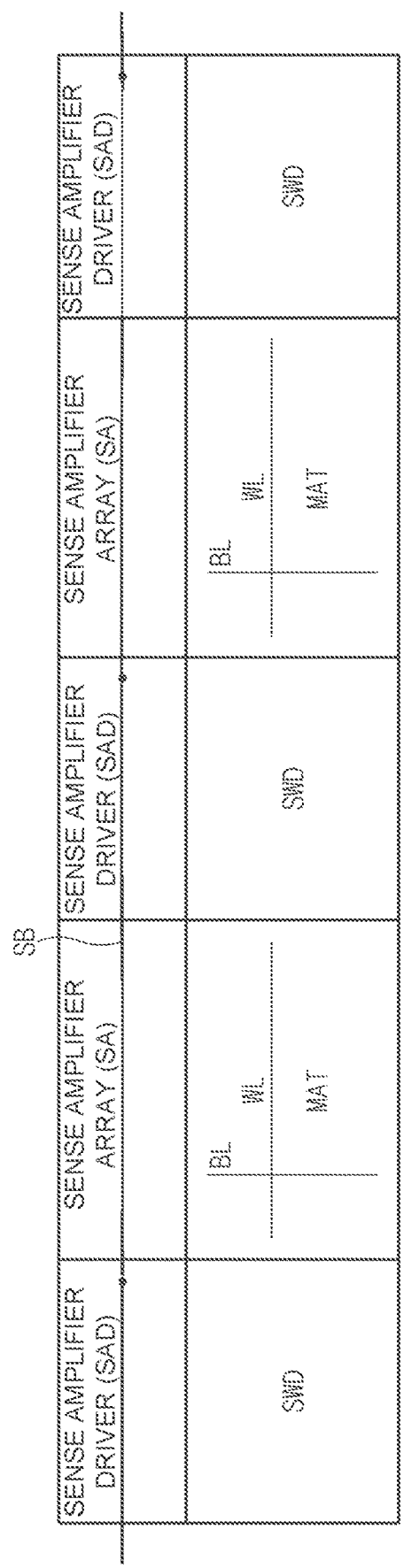
FIG. 2 is a view illustrating a representation of an example of a layout structure of the semiconductor device shown in FIG. 1.

FIG. 2 is a view illustrating a representation of an example of a layout structure of the semiconductor device shown in FIG. 1.

Referring to FIG. 2, the semiconductor device according to an embodiment of the present disclosure may include a mat MAT, a sub word line driver SWD, a sense-amplifier driver SAD, and a sense-amplifier array SA.

In this case, the mat MAT may include a cell in an intersection region of the bit line BL and the word line WL, and the mat MAT may store data in the cell. The sub word line driver SWD may drive the word line WL to select a row line. The sense-amplifier array SA may sense and amplify data received from the mat MAT through the bit line BL. The sense-amplifier driver SAD may generate not only drive signals for controlling operation of the sense-amplifier array SA, but also a power-supply signal.

In accordance with an embodiment, the sense-amplifier MCSA, the pull-up driver PUD, the pull-down driver PDD, and the pull-down voltage controller 110 illustrated in FIG. 1 may be contained in the sense-amplifier driver SAD. The pull-down power-supply line SB may be driven by the pull-down voltage generated by the sense-amplifier driver SAD, and may be coupled to each sense-amplifier array SA.

FIGS. 3 to 10 illustrate various examples of the pull-down voltage controller shown in FIG. 1.

Figure 3:
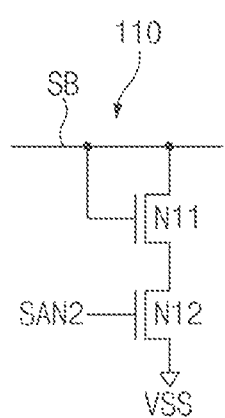
FIGS. 3 to 10 illustrate various examples of a pull-down voltage controller shown in FIG. 1.

Referring to FIG. 3, the pull-down voltage controller 110 may include NMOS transistors N11 and N12.

The NMOS transistor N11 and the NMOS transistor N12 may be coupled in series between the pull-down power-supply line SB and the ground voltage (VSS) input terminal. The NMOS transistor N11 may be comprised of a diode structure in which a drain terminal and a gate terminal of the NMOS transistor N11 are commonly coupled to the pull-down power-supply line SB. Accordingly, the NMOS transistor N11 may be coupled between the pull-down power-supply line SB and the NMOS transistor N12 such that a drain terminal and a gate terminal of the NMOS transistor N11 may be commonly coupled to each other. The NMOS transistor N12 may receive a pull-down control signal SAN2 through a gate terminal thereof. Further, the NMOS transistor N12 may selectively provide the ground voltage VSS in response to the pull-down control signal SAN2.

When the NMOS transistor N12 is turned on by activation of the pull-down control signal SAN2, the pull-down voltage controller 110 may increase a voltage level of the pull-down power-supply line SB by a predetermined level. For example, the pull-down voltage controller 110 may increase a voltage level of the pull-down power-supply line SB by a threshold voltage of the NMOS transistor N11. That is, the level of the pull-down power-supply line SB may be set to a desired target value by adjusting the threshold voltage of the NMOS transistor N11.

The embodiment of the present disclosure may further include the pull-down driver PDD and the pull-down voltage controller 110, such that a level of the pull-down power-supply line SB may increase the pull-down power-supply line (SB) level prior to the sensing operation. As a result, the bit line precharge voltage VBLP may maintain a half value of the core voltage, such that the bit line precharge voltage VBLP can be stably maintained before the sensing operation.

Figure 4:
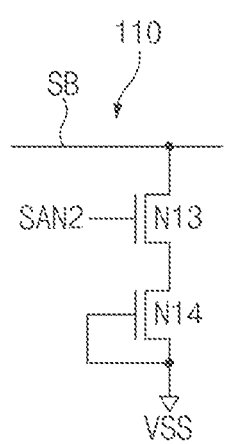

Referring to FIG. 4, the pull-down voltage controller 110 may include NMOS transistors N13 and N14.

The NMOS transistor N13 and the NMOS transistor N14 may be coupled in series between the pull-down power-supply line SB and the ground voltage (VSS) input terminal. The NMOS transistor N13 may be coupled between the pull-down power-supply line SB and the NMOS transistor N14 and receive a pull-down control signal SAN2 through a gate terminal thereof. The NMOS transistor N14 may be comprised of a diode structure in which a source terminal and a gate terminal of the NMOS transistor N14 are commonly coupled to the ground voltage (VSS) input terminal.

When the NMOS transistor N13 is turned on by activation of the pull-down control signal SAN2, the pull-down voltage controller 110 may increase a voltage level of the pull-down power-supply line SB by a predetermined level. For example, the pull-down voltage controller 110 may increase a voltage level of the pull-down power-supply line SB by a threshold voltage of the NMOS transistor N14.

Figure 5:
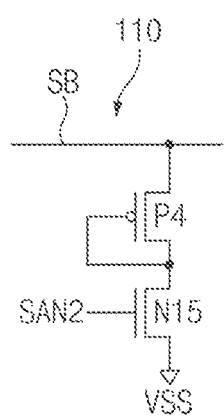

Referring to FIG. 5, the pull-down voltage controller 110 may include a PMOS transistor and an NMOS transistor N15.

In this case, the PMOS transistor P4 and the NMOS transistor N15 may be coupled in series between the pull-down power-supply line SB and the ground voltage (VSS) input terminal. The PMOS transistor P4 may be coupled between pull-down power-supply line SB and the NMOS transistor N15, and the PMOS transistor P4 may be comprised of a diode structure in which a drain terminal and a gate terminal of the PMOS transistor P4 are commonly coupled to each other. The NMOS transistor N15 may receive a pull-down control signal SAN2 through a gate terminal thereof, and the NMOS transistor N15 may provide a ground voltage VSS in response to the pull-down control signal SAN2.

When the NMOS transistor N15 is turned on by activation of the pull-down control signal SAN2, the pull-down voltage controller 110 may increase a voltage level of the pull-down power-supply line SB by a predetermined level. For example, the pull-down voltage controller 110 may increase a voltage level of the pull-down power-supply line SB by a threshold voltage of the PMOS transistor P4. For example, the pull-down voltage controller 110 may increase a voltage level of the pull-down power-supply line SB by a threshold voltage of the PMOS transistor P4.

Figure 6:
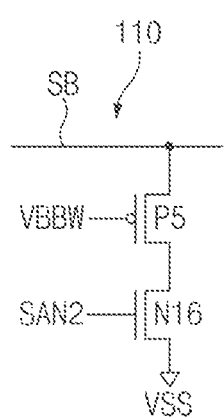

Referring to FIG. 6, the pull-down voltage controller 110 may include a PMOS transistor P5 and an NMOS transistor N16.

In this case, the PMOS transistor P5 and the NMOS transistor N16 may be coupled in series between the pull-down power-supply line SB and the ground voltage (VSS) input terminal. The PMOS transistor P5 may be coupled between the pull-down power-supply line SB and the NMOS transistor N16 to receive a back-bias voltage VBBW having a negative bias through a gate terminal thereof. The NMOS transistor N16 may receive a pull-down control signal SAN2 through a gate terminal thereof, and the NMOS transistor N16 may provide the ground voltage VSS in response to the pull-down control signal SAN2.

When the NMOS transistor N16 is turned on by activation of the pull-down control signal SAN2, the pull-down voltage controller 110 may increase the voltage level of the pull-down power-supply line SB by a predetermined level. For example, the pull-down voltage controller 110 may adjust a bias-voltage level of the back-bias voltage VBBW applied to a gate terminal of the PMOS transistor P5. Therefore, a voltage level of the pull-down power-supply line SB can be increased by the driving power of the PMOS transistor P5.

Figure 7:
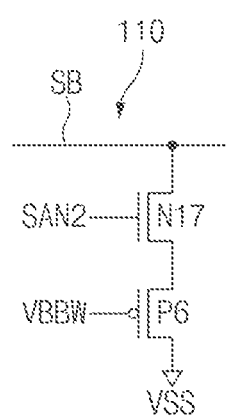

Referring to FIG. 7, the pull-down voltage controller 110 may include an NMOS transistor N17 and a PMOS transistor P6.

In this case, the NMOS transistor N17 and the PMOS transistor P6 may be coupled in series between the pull-down power-supply line SB and the ground voltage (VSS) input terminal. The NMOS transistor N17 may be coupled between pull-down power-supply line SB and the PMOS transistor P6 to receive a pull-down control signal SAN2 through a gate terminal thereof. The PMOS transistor P6 may receive a back-bias voltage VBBW through a gate terminal thereof. Further, the PMOS transistor P6 may provide the ground voltage VSS in response to the back-bias voltage VBBW having a negative bias.

When the NMOS transistor N17 is turned on by activation of the pull-down control signal SAN2, the pull-down voltage controller 110 may increase the voltage level of the pull-down power-supply line SB by a predetermined level. For example, the pull-down voltage controller 110 may receive a back-bias voltage VBBW having a negative bias-voltage level through a gate terminal of the PMOS transistor P6, and may thus increase a voltage level of the pull-down power-supply SB by a predetermined level.

Figure 8:
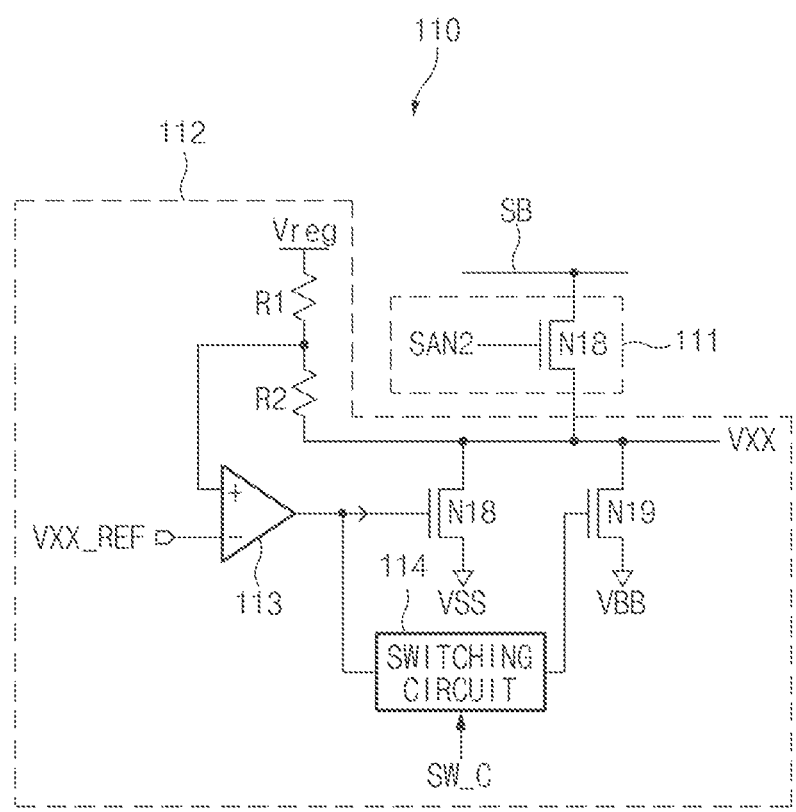

Referring to FIG. 8, the pull-down voltage controller 110 may include a pull-down driver 111 and a voltage generator 112.

In this case, the pull-down driver 111 may include an NMOS transistor N18. The NMOS transistor N18 may be coupled between the pull-down power-supply line SB and a drive voltage (VXX) node, and may thus receive a pull-down control signal SAN2 through a gate terminal thereof. The pull-down drive driver 111 may provide the drive voltage VXX to the pull-down power-supply line SB in response to the pull-down control signal SAN2.

The voltage generator 112 may generate a drive voltage VXX higher than a reference voltage VXX_REF, such that the generated drive voltage VXX may be provided as a source bias voltage to the pull-down power-supply line SB. In this case, the drive voltage VXX may be adjusted in response to the reference voltage VXX_REF or a regulation voltage Vreg, such that the drive voltage VXX may be adjusted within a specific range.

Therefore, when the pull-down driver 111 is turned on by activation of the pull-down control signal SAN2, the voltage level of the pull-down power-supply line SB may increase by a predetermined level upon receiving the drive voltage VXX from the voltage generator 112.

The voltage generator 112 may include a plurality of resistors R1 and R2, a comparator 113, NMOS transistors N18 and N19, and a switching circuit 114. The resistors R1 and R2 may be coupled in series between a regulation voltage (Vreg) input terminal and the drive voltage (VXX) node. The comparator 113 may compare a division voltage received from a common connection node of the resistors R1 and R2 with the reference voltage VXX_REF, and may thus output the result of comparison to the NMOS transistors N18 and N19.

The NMOS transistor N18 may be coupled between the drive voltage (VXX) node and the ground voltage (VSS) input terminal, and may receive an output signal of the comparator 113 through a gate terminal thereof. The switching circuit 114 may selectively output the output signal of the comparator 113 to the NMOS transistor N18 in response to a switching control signal SW_C. The NMOS transistor N19 may be coupled between the drive voltage (VXX) node and the back-bias voltage (VBB) input terminal, and may thus receive the output signal of the switching circuit 114 through a gate terminal thereof.

For example, when the drive voltage VXX is higher than the reference voltage VXX_REF, the output signal of the comparator 113 is a logic high level, such that the NMOS transistors N18 and N19 are turned on. As a result, a voltage of the pull-down power-supply line SB may increase by a predetermined level according to the drive voltage VXX.

In this case, when the switching circuit 114 does not operate by deactivation of the switching control signal SW_C, only the NMOS transistor N18 may be turned on. In contrast, when the switching circuit 114 operates by activation of the switching control signal SW_C, the NMOS transistors N18 and N19 are turned on, such that the drive voltage VXX may be more rapidly driven.

Figure 9:
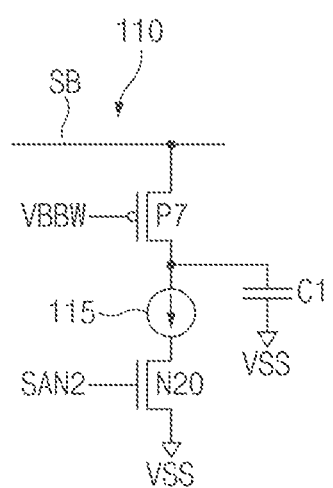

Referring to FIG. 9, the pull-down voltage controller 110 may include a PMOS transistor P7, an NMOS transistor N20, a constant current source 115, and a capacitor C1.

The PMOS transistor P7 may be coupled between the pull-down power-supply line SB and the constant current source 115 to receive a back-bias voltage VBBW through a gate terminal thereof. The back-bias voltage VBBW may have a negative voltage level.

The constant current source 115 may output a constant current having a predetermined level to the NMOS transistor N20. The NMOS transistor N20 may be coupled between the constant current source 115 and the ground voltage (VSS) input terminal, and may receive a pull-down control signal SAN2 through a gate terminal thereof. A capacitor C1 may be coupled between the ground voltage (VSS) input terminal and a common connection node of the PMOS transistor P7 and the constant current source.

The PMOS transistor P7 may be turned on by the back-bias voltage VBBW. The NMOS transistor N20 may be turned on by activation of the pull-down control signal SAN2. As a result, when a predetermined constant current flows in the constant current source 115, the voltage level of the pull-down power-supply line SB may increase by a predetermined level according to a current charged in the capacitor C1.

Figure 10:
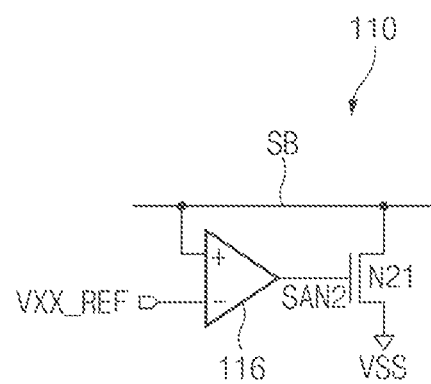

Referring to FIG. 10, the pull-down voltage controller 110 may include a comparator 116 and an NMOS transistor N21.

In this case, the comparator 116 may compare a voltage of the pull-down power-supply line SB with the reference voltage VXX_REF, and may thus output a pull-down control signal SAN2 according to the result of comparison. The comparator 116 may control a pulse width of the pull-down control signal SAN2 according to the result of comparison between the pull-down power-supply line (SB) voltage and the reference voltage VXX_REF. The NMOS transistor N21 may be coupled between the pull-down power-supply line SB and the ground voltage (VSS) input terminal, and may thus receive the pull-down control signal SAN2 through a gate terminal thereof. That is, the pulse width of the pull-down control signal SAN2 may be adjusted according to a level variation of the output signal of the comparator 116.

For example, when the pull-down power-supply line (SB) voltage is higher than the reference voltage VXX_REF, the output signal of the comparator 116 is at a logic high level, such that the pull-down control signal SAN2 may be activated. As a result, the NMOS transistor N21 is turned on, such that the pull-down power-supply line (SB) voltage may increase by a predetermined level. In contrast, when the pull-down power-supply line (SB) voltage is less than the reference voltage VXX_REF, the output signal of the comparator 116 is at a logic low level, such that the pull-down control signal SAN2 may be deactivated.

That is, a disable time of the pull-down control signal SAN2 may be adjusted according to the result of a comparison between the pull-down power-supply line (SB) voltage and the reference voltage VXX_REF. As a result, the pulse width of the pull-down control signal SAN2 is adjusted, such that the NMOS transistor N21 is turned off before the pull-down power-supply line (SB) is completely pulled down to the ground voltage (VSS) level.

Figure 11:
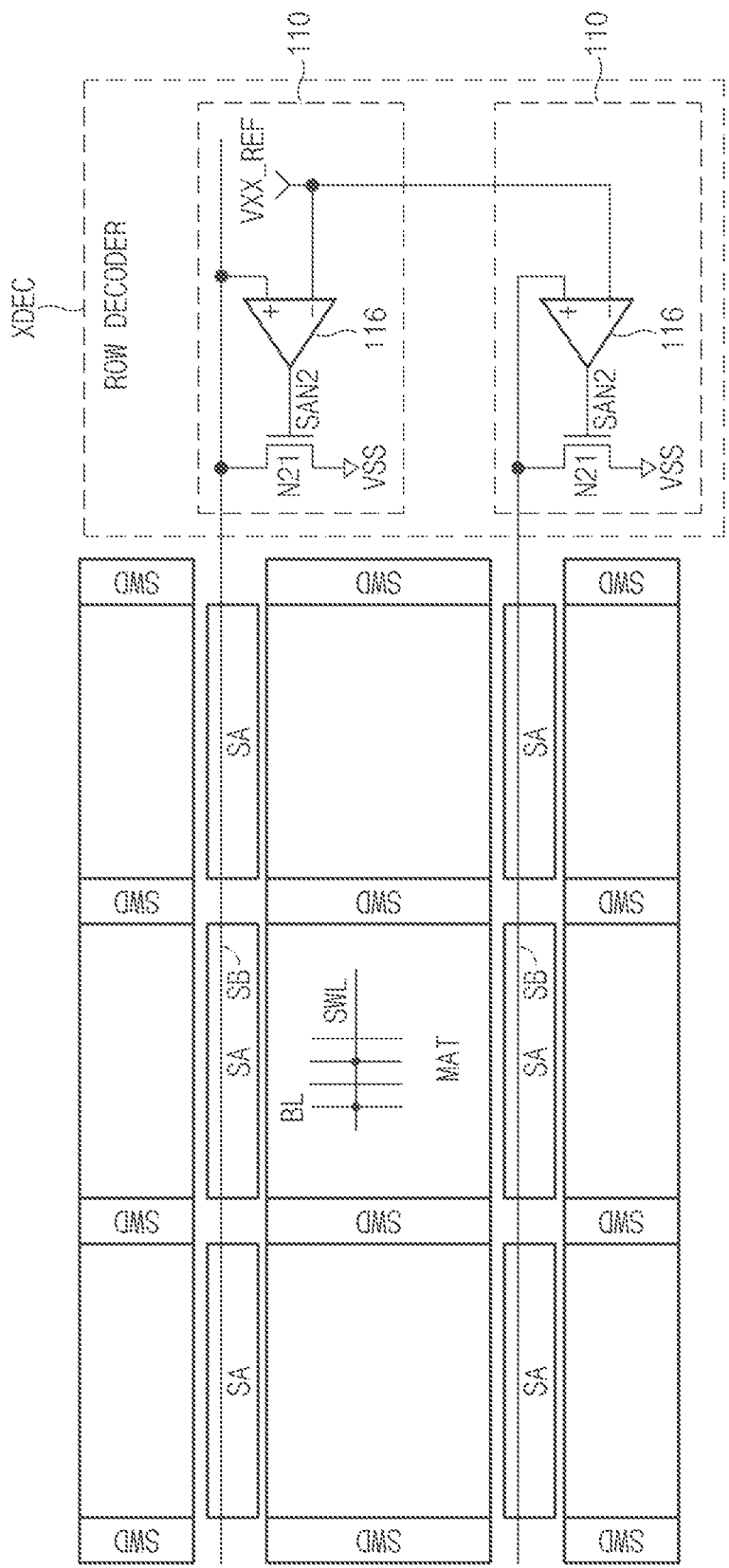
FIG. 11 is a view illustrating a representation of an example of a pull-down voltage controller shown in FIG. 1.

FIG. 11 is a view illustrating a representation of an example of a layout structure of the pull-down voltage controller 110 shown in FIG. 10.

Referring to FIG. 11, the pull-down voltage controller 110 shown in FIG. 10 may control a turn-on or turn-off time of the NMOS transistor N21 by detecting a voltage level of the pull-down power-supply line SB.

For this purpose, the pull-down voltage controller 110 shown in FIG. 10 may be located in a row decoder XDEC as illustrated in FIG. 11. That is, the pull-down voltage controller 110 must detect the voltage level of the pull-down power-supply line (SB), such that the pull-down voltage controller 110 may be located in the row decoder XDEC located adjacent to the sense-amplifier array SA. The row decoder XDEC may be located in an edge region of one side of the bank.

Figure 12:
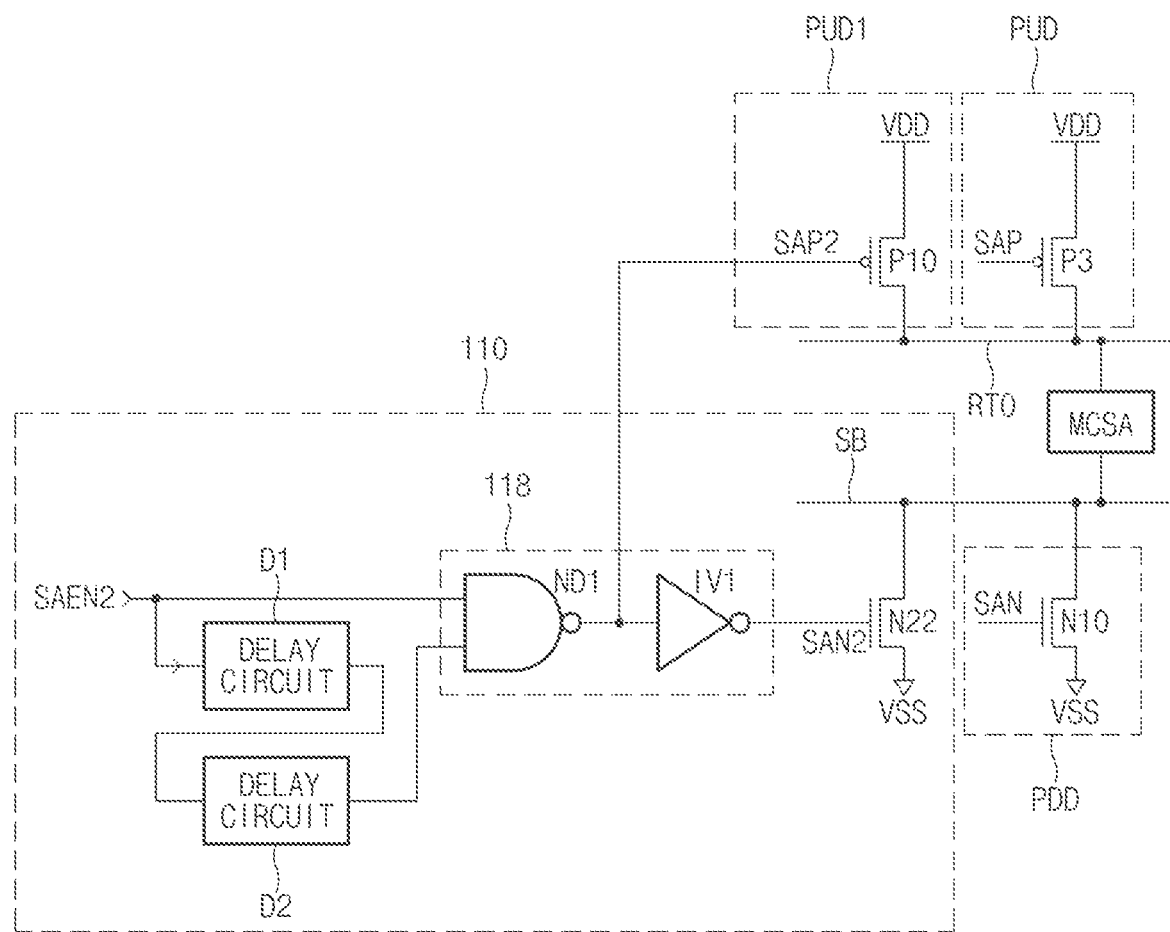
FIG. 12 is a view illustrating another example of the pull-down voltage controller shown in FIG. 1.

Referring to FIG. 12, the pull-down voltage controller 110 may include a plurality of delay circuits D1 and D2, a combination circuit 118, and an NMOS transistor N22.

In this case, the plurality of delay circuits D1 and D2 may delay a sensing enable signal SAEN2 by a predetermined time, and may output the delayed sensing enable signal SAEN2.

The combination circuit 118 may output the pull-down control signal SAN2 by performing a logic operation between the output signal of the sensing enable signal SAEN2 and the output signal of the delay circuit D2. The combination circuit 118 may activate the pull-down control signal SAN2 when the output signal of the sensing enable signal SAEN2 and the output signal of the delay circuit D2 are at a logic high level. The combination circuit 118 may output the pull-down control signal SAN2 by combining sensing enable signal SAEN2 and the output signals of the plurality of delay circuits D1 and D2.

The combination circuit 118 may include a NAND gate ND1 and an inverter IV1. The NAND gate ND1 may perform a NAND operation between the output signal of the sensing enable signal SAEN2 and the output signal of the delay circuit D2. The inverter IV1 may output the pull-down control signal SAN2 by inverting the output signal of the NAND gate ND1. The NMOS transistor N22 may be coupled between the pull-down power-supply line SB and the ground voltage (VSS) input terminal, and may thus receive the pull-down control signal SAN2 through a gate terminal thereof.

The pull-down voltage controller 110 may variably control the pulse width of the pull-down control signal SAN2 in response to delay times of the delay circuits D1 and D2. That is, the pull-down voltage controller 110 may adjust a disable time of the pull-down control signal SAN2 according to the delay times of the delay circuits D1 and D2.

For example, when the output signal of the sensing enable signal SAEN2 and the output signal of the delay circuit D2 are at a logic high level, the pull-down control signal SAN2 is activated, such that the pull-down power-supply line (SB) voltage may increase by a predetermined level. In contrast, when any one of the output signal of the sensing enable signal SAEN2 and the output signal of the delay circuit D2 is at a logic low level, the pull-down control signal SAN2 may be deactivated and the NMOS transistor N22 may remain turned off.

In addition, as shown in FIG. 12, the embodiment of the present disclosure may further include a pull-up drive element PUD1. The pull-up drive element PUD1 may pull up the pull-up power-supply line RTO to a power-supply voltage (VDD) level in response to the pull-up drive signal SAP2. The pull-up drive signal SAP2 is the output signal of the NAND gate ND1.

The pull-up drive element PUD1 may include a PMOS transistor P10 that is coupled between the power-voltage (VDD) input terminal and the pull-up power-supply line RTO and receives a pull-up drive signal SAP2 through a gate terminal. When the output signal of the NAND gate ND1 is at a logic low level, the PMOS transistor P10 is turned on, such that a voltage level of the pull-up power-supply line RTO may increase.

The embodiment of the present disclosure may drive both the pull-up drive element PUD and the pull-up drive element PUD1 in the offset compensation period. Accordingly, the current drivability of the PMOS transistors P3 and P10 may be improved to increase the voltage level of the pull-up power-supply line RTO.

Figure 13:
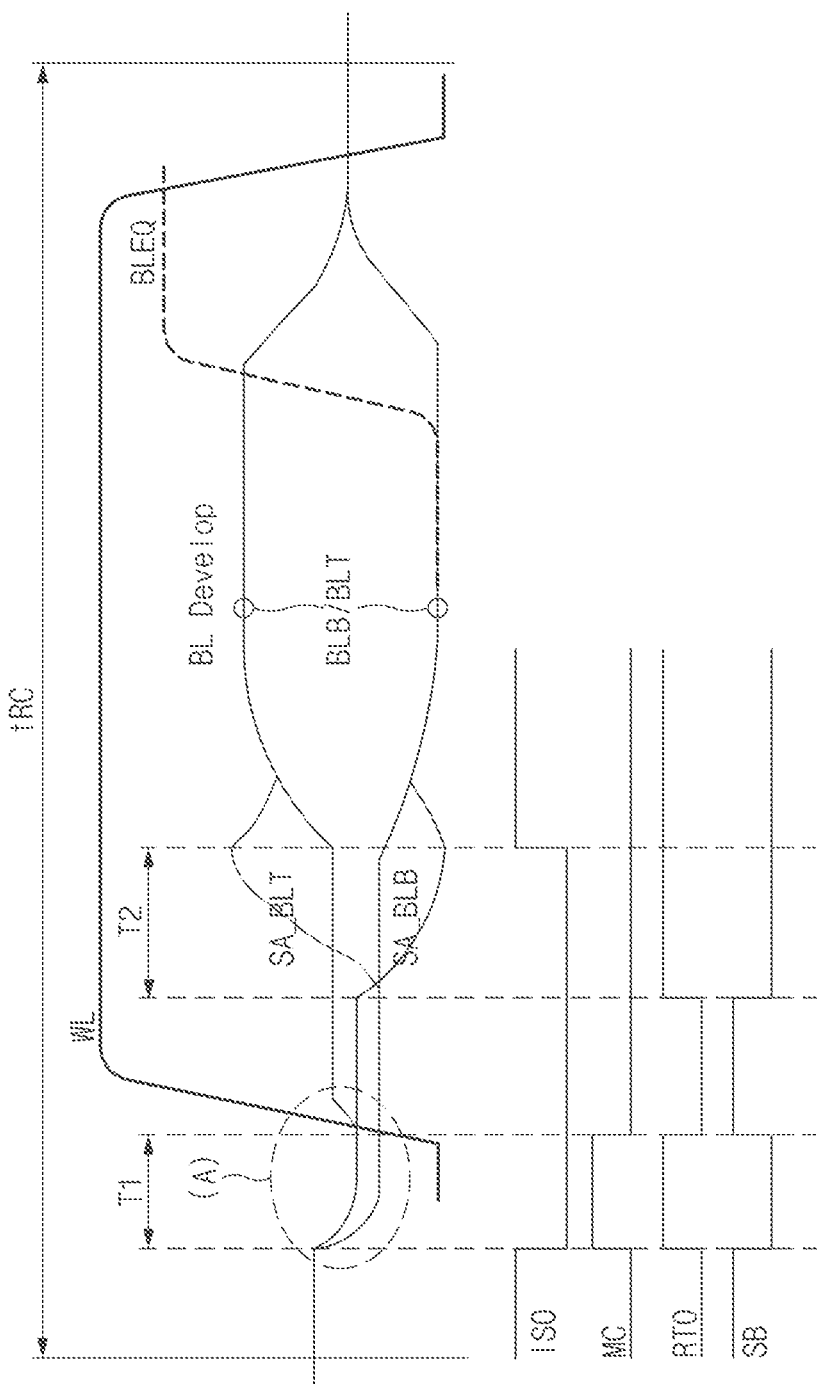
FIGS. 13 and 14 are timing diagrams illustrating representations of examples of operations of the semiconductor device according to an embodiment of the present disclosure.
Figure 14:
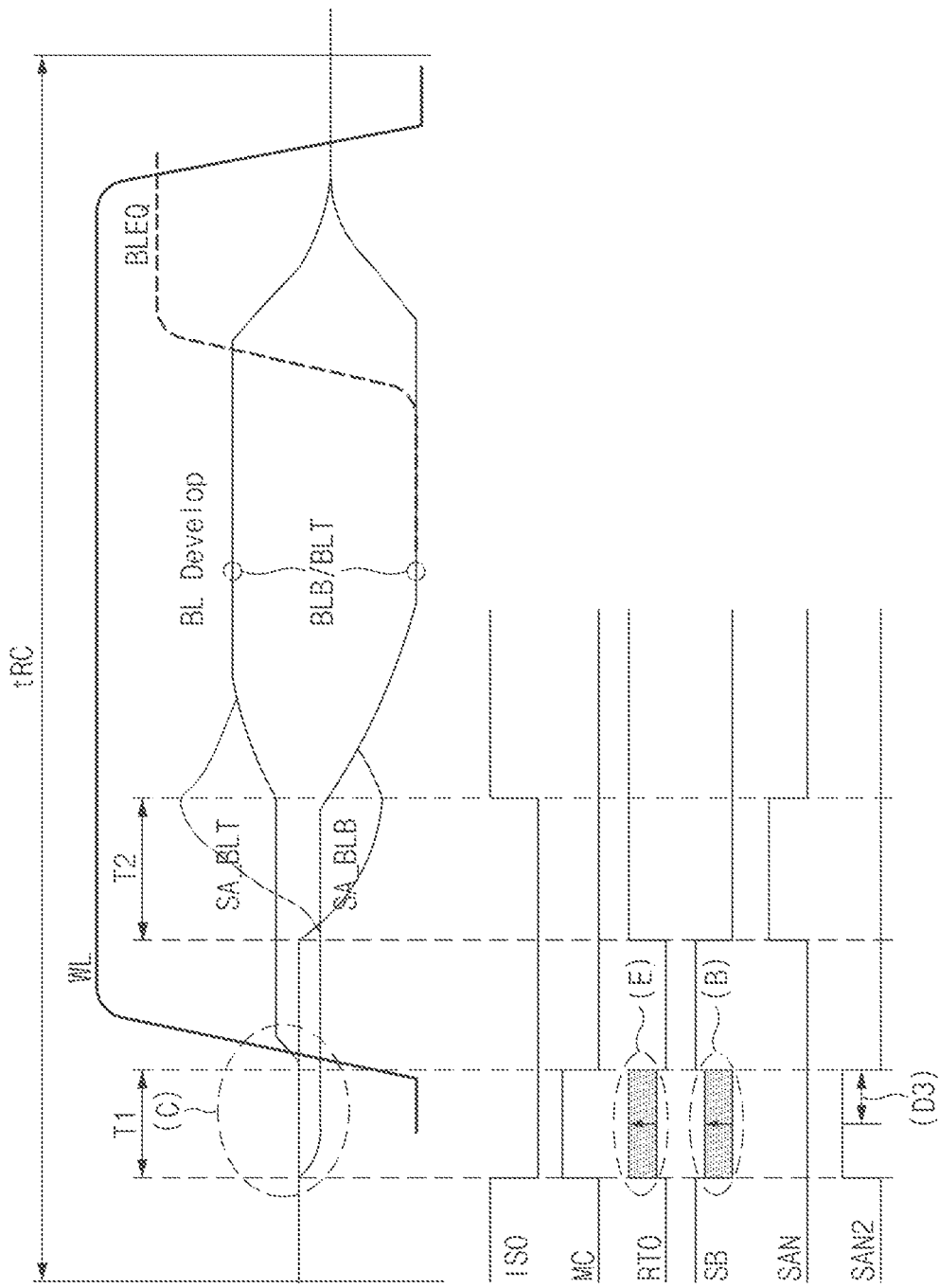

FIGS. 13 and 14 are timing diagrams illustrating representations of examples of operations of the semiconductor device according to an embodiment of the present disclosure.

Referring to FIG. 13, the word line WL may remain disabled in an offset compensation period T1. That is, the offset compensation period T1 may compensate for a mismatch of the pair of the sensing bit lines SA_BLT and SA_BLB in a time period before the word line WL is enabled.

In the offset compensation period T1, the pull-up power-supply line RTO is at a logic high level and the pull-down power-supply line SB is at a logic low level, such that the sense-amplifier MCSA is powered on. Because a connection control signal MC is at a logic high level and a connection control signal ISO is at a logic low level, the bit line BLT is coupled to the sensing bit line bar SA_BLB, and the bit line bar BLB is coupled to the sensing bit line SA_BLT prior to activation of a word line WL. Therefore, the pair of the sensing bit lines SA_BLT and SA_BLB may be precharged in the offset compensation period T1, such that the pair of the sensing bit lines SA_BLT and SA_BLB may remain at the bit line precharge voltage (VBLP) level during the offset compensation period T1.

Thereafter, during a pre-sensing period T2, electric charges of the pair of the sensing bit lines SA_BLT and SA_BLB may increase by a predetermined level before arriving at the pair of bit lines BLT and BLB, such that the sensing operation of the pair of the bit lines BLT and BLB can be rapidly carried out.

If the word line WL is activated in the pre-sensing period T2, all the connection control signals MC and ISO may be deactivated. As a result, the connection controller 103 is turned off, such that the pair of the bit lines BLT and BLB may be disconnected from the pair of the sensing bit lines SA_BLT and SA_BLB. In the pre-sensing period T2, the pair of the bit lines BLT and BLB and the pair of the sensing bit lines SA_BLT and SA_BLB may have different waveforms.

In the pre-sensing period T2, the pull-up power-supply line RTO may be at a logic high level, and the pull-down power-supply line SB may be at a logic low level. The pre-sensing operation of the pair of the sensing bit lines SA_BLT and SA_BLB is carried out when the sense-amplifier MCSA is powered on, such that development of charges of the pair of the sensing bit lines SA_BLT and SA_BLB may be started.

In the operation period of the sense-amplifier MCSA after lapse of the pre-sensing period T2, charges of the pair of the bit lines BLT and BLB may be shared. In the operation period of the sense-amplifier MCSA, the connection control signal ISO is activated, such that the bit line BLT may be coupled to the sensing bit line SA_BLT and the bit line bar BLB may be coupled to the sensing bit line bar SA_BLB. That is, during the pre-sensing period T2, the sensing operation of the pair of the sensing bit lines SA_BLT and SA_BLB contained in the sense-amplifier MCSA is first carried out, and the sensing operation of the pair of the bit lines BLT and BLB is then carried out after lapse of the pre-sensing period T2, resulting in implementation of data storage.

Thereafter, when the bit line equalization signal BLEQ is activated, the precharge circuit 102 of the sense-amplifier MCSA may be precharged with the bit line precharge voltage (VBLP) level. When the word line WL is deactivated, a row cycle time (tRC) period is terminated.

However, in the offset compensation period T1, the bit line precharge voltage (VBLP) level may be reduced by a resistance component of the pull-up circuit 100 and a threshold voltage of each transistor of the pull-down circuit 101 contained in the sense-amplifier MCSA. Specifically, the bit line precharge voltage (VBLP) level may be reduced when threshold voltages of the NMOS transistors N1 and N2 of the pull-down circuit 101 are low.

That is, the precharge voltage level may not be stably maintained, and the bit line precharge voltage (VBLP) level may be reduced as shown by reference symbol (A) of FIG. 13. As a result, if the bit line precharge voltage (VBLP) level is less than a half of the core voltage, power consumption may unavoidably increase.

Therefore, as can be seen from FIG. 14, when the pull-down control signal SAN2 is activated in the offset compensation period T1, a voltage level of the pull-down power-supply line SB may increase by a predetermined level as shown by reference symbol (B) of FIG. 14. That is, a voltage level of the pull-down power-supply line SB acting as a source bias of the pull-down circuit 101 is increased, such that the pull-down power-supply line SB may remain at the bit line precharge voltage (VBLP) level as shown by reference symbol (C) of FIG. 14.

In addition, when the pull-up drive signal SAP2 is activated in the offset compensation period T1, a voltage level of the pull-up power-supply line RTO may increase by a predetermined level as shown by reference symbol (E) of FIG. 14. That is, a voltage level of the pull-up power-supply line RTO is increased, such that the pull-up power-supply line RTO may remain at the bit line precharge voltage (VBLP) level.

In this case, in the offset compensation period T1, a pulse width D3 of the pull-down control signal SAN2 is adjusted such that a voltage level of the pull-down power-supply line SB may also be adjusted. That is, according to the embodiments of FIGS. 10 to 12, a pulse width of the pull-down control signal SAN2 is adjusted such that a voltage level of the pull-down power-supply line SB may be established. In the pre-sensing period T2, the pull-down drive signal SAN is activated, such that the pull-down power-supply line SB may be pulled down to the ground voltage (VSS) level.

Figure 15:
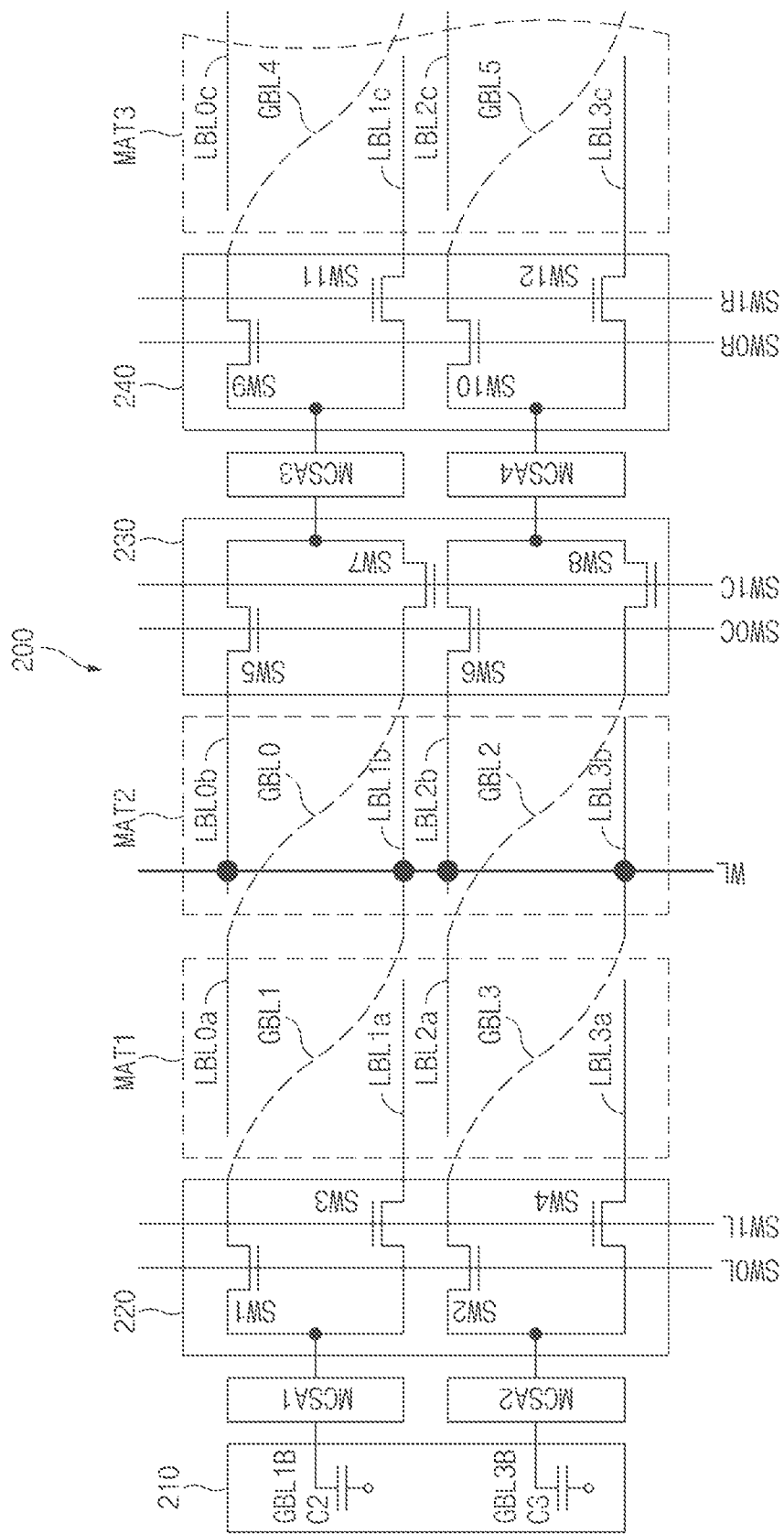
FIG. 15 is a schematic view illustrating a representation of an example of a semiconductor device according to another embodiment of the present disclosure.

FIG. 15 is a schematic view illustrating a representation of an example of a semiconductor device according to another embodiment of the present disclosure.

Referring to FIG. 15, a semiconductor device may include a plurality of mats MAT1~MAT3, a plurality of sense-amplifiers MCSA1~MCSA4, a loading circuit 210, and a plurality of switching circuits 220~240.

The plurality of mats MAT1~MAT3 may be respectively coupled to the plurality of sense-amplifiers MCSA1~MCSA4 through a local bit line and a global bit line, resulting in formation of a hierarchical bit line structure. That is, the mat MAT1 may be coupled to local bit lines LBL0a~LBL3a and odd global bit lines GBL1 and GBL3. The mat MAT2 may be coupled to local bit lines LBL0b~LBL3b and even global bit lines GBL0 and GBL2. The first mat MAT1 may be located adjacent to the second mat MAT2. In addition, the mat MAT3 may be coupled to local bit lines LBL0c~LBL3c and global bit lines GBL4 and GBL5.

In this case, the odd local bit lines LBL1a and LBL3a of the mat MAT1 may be coupled to the sense-amplifiers MCSA1 and MCSA2 through the switching circuit 220. The even local bit lines LBL0a and LBL2a of the mat MAT1 may be respectively coupled to the sense-amplifiers MCSA3 and MCSA4 through the even global bit lines GBL0 and GBL2. The odd global bit lines GBL1 and GBL3 may be located in the mat MAT1, and the even global bit lines GBL0 and GBL2 may be located in the mat MAT2.

Therefore, the odd local bit lines LBL1a and LBL3a of the mat MAT1 may be coupled to contiguous sense-amplifiers MCSA1 and MCSA2. In contrast, the even local bit lines LBL0a and LBL2a of the mat MAT1 may be respectively coupled to the sense-amplifiers MCSA3 and MCSA4 through the even global bit lines GBL0 and GBL2 and the switching circuit 230.

The even local bit lines LBL0b and LBL2b of the mat MAT2 may be coupled to the sense-amplifiers MCSA3 and MCSA4 through the switching circuit 230. The odd local bit lines LBL1b and LBL3b of the mat MAT2 may be respectively coupled to the sense-amplifiers MCSA1 and MCSA2 through the odd global bit lines GBL1 and GBL3.

Therefore, the even local bit lines LBL0b and LBL2b of the mat MAT2 may be coupled to contiguous sense-amplifiers MCSA3 and MCSA4. In contrast, the odd local bit lines LBL1b and LBL3b of the mat MAT2 may be coupled to the sense-amplifiers MCSA1 and MCSA2 through the switching circuit 220 and respectively the odd global bit lines GBL1 and GBL3.

The switching circuit 220 may selectively control a connection between the mat MAT1 and the sense-amplifiers MCSA1 and MCSA2 in response to the switching signals SW0L and SW1L. The switching circuit 220 may include a plurality of switching elements SW1~SW4. In this case, the switching elements SW1 and SW2 may selectively control connection of the sense-amplifiers MCSA1 and MCSA2 and the odd global bit lines GBL1 and GBL3 in response to the switching signal SW0L. The switching elements SW3 and SW4 may selectively control connection of the sense-amplifiers MCSA1 and MCSA2 and the respective odd local bit lines LBL1a and LBL3a in response to the switching signal SW1L.

The switching circuit 230 may selectively control a connection between the mat MAT2 and the sense-amplifiers MCSA3 and MCSA4 in response to the switching signals SW0C and SW1C. The switching circuit 230 may include a plurality of switching elements SW5~SW8. In this case, the switching elements SW5 and SW6 may selectively control connection of the sense-amplifiers MCSA3 and MCSA4 and the even local bit lines LBL0a and LBL2a in response to the switching signal SW0C. The switching elements SW7 and SW8 may selectively control connection of the sense-amplifiers MCSA3 and MCSA4 and the respective even global bit lines GBL0 and GBL2 in response to the switching signal SW1C.

In addition, the switching circuit 240 may selectively control a connection between the mat MAT3 and the sense-amplifiers MCSA3 and MCSA4 in response to the switching signals SW0R and SW1R. The switching circuit 240 may include a plurality of switching elements SW9~SW12. In this case, the switching elements SW9 and SW10 may selectively control connection of the sense-amplifiers MCSA3 and MCSA4 and the global bit lines GBL4, GBL5 in response to the switching signal SW0R. The switching elements SW11 and SW12 may selectively control connection of the sense-amplifiers MCSA3 and MCSA4 and the respective odd local bit lines LBL1C and LBL3C in response to the switching signal SW1R.

The loading circuit 210 may provide a reference voltage when the sense-amplifiers MCSA3 and MCSA4 are operated. The loading circuit 210 may include a capacitor C2 coupled to the sense-amplifier MCSA3 and a capacitor C3 coupled to the sense-amplifier MCSA4. For example, when the odd global bit lines GBL1 and GBL3 of the mat MAT1 are selected or the odd local bit lines LBL1a and LBL3a are selected, the loading circuit 210 may operate by the reference lines GBL1B and GBL3B.

For example, it is assumed that the word line WL of the mat MAT2 is activated. As a result, the even local bit lines LBL0b and LBL2b may be coupled to the contiguous sense-amplifiers MCSA3 and MCSA4 through the switching circuit 230. The odd local bit lines LBL1b and LBL3b may be coupled to the contiguous sense-amplifiers MCSA1 and MCSA2 through the switching circuit 220 and the odd global bit lines GBL1 and GBL3.

In this case, the odd local bit lines LBL1b and LBL3b may not be coupled to the contiguous sense-amplifiers MCSA3 and MCSA4, and may be coupled to the sense-amplifiers MCSA1 and MCSA2 through the odd global bit lines GBL1 and GBL3. Accordingly, the even local bit lines LBL0b and LBL2b of the mat MAT2 and the odd local bit lines LBL1b and LBL3b of the mat MAT2 may have different lengths. That is, the odd local bit lines LBL1b and LBL3b may have a longer loading time as compared to the even local bit lines LBL0b and LBL2b.

In a general sense-amplifier, a loading time of the bit line BLT must be identical to a loading time of the bit line bar BLB, such that offset deterioration does not occur. However, according to an embodiment of the present disclosure, the pair of bit lines BLT and BLB of the cell region is separated from the pair of sensing bit lines SA_BLT and SA_BLB of the sense-amplifier MCSA region as shown in FIG. 1, such that a difference in loading between the sensing bit line and a reference bit line need not be considered. According to the sense-amplifier MCSA of an embodiment of the present disclosure, the operation of the pair of bit lines BLT and BLB may be separated from the operation of the pair of sensing bit lines SA_BLT and SA_BLB during the pre-sensing period T2.

That is, charge division of the pair of the sensing bit lines SA_BLT and SA_BLB may first be performed during the pre-sensing period T2, and charge division of the pair of the bit lines BLT and BLB may then be performed after lapse of the pre-sensing period T2. In the pre-sensing period T2, at least one sense-amplifier MCSA may perform the sensing operation of only the pair of the sensing bit lines SA_BLT and SA_BLB if the pair of bit lines BLT and BLB are separated from the pair of sensing bit line SA_BLT and SA_BLB. Therefore, mismatch caused by loading of the pair of the bit lines BLT and BLB may not affect the operation of the sense-amplifier MCSA.

When there is a difference in loading between the bit lines BLT and BLB in the general sense-amplifier, an offset caused by a difference in loading between the bit lines BLT and BLB may increase. However, an embodiment of the present disclosure may include the sense-amplifier MCSA structure in which loading between a true line and a bar line need not be matched as shown in FIG. 1.

In accordance with an embodiment of the present disclosure, the sensing operation is achieved only in the sense-amplifier MCSA during the pre-sensing period T2, and loading of the pair of bit lines BLT and BLB is re-connected after lapse of the pre-sensing period T2. An embodiment of the present disclosure may improve the sense-amplifier offset caused by a loading mismatch between the bit lines at an early stage of the sensing operation.

Therefore, an embodiment of the present disclosure may not include an additional dummy region in an edge region of the bank having an open bit line structure. That is, an embodiment of the present disclosure includes a relatively small-sized loading circuit 210 instead of additional dummy cells to form a reference line needed to correct loading of the bit line, such that the entire region can be reduced in size and the sensing margin can be improved. In other words, the loading circuit 210 located in an edge region of the first mat MAT1 may correct loading of at least one sense-amplifier MCSA1 and MSCA2 adjacent to the first mat MAT1.

Figure 16:
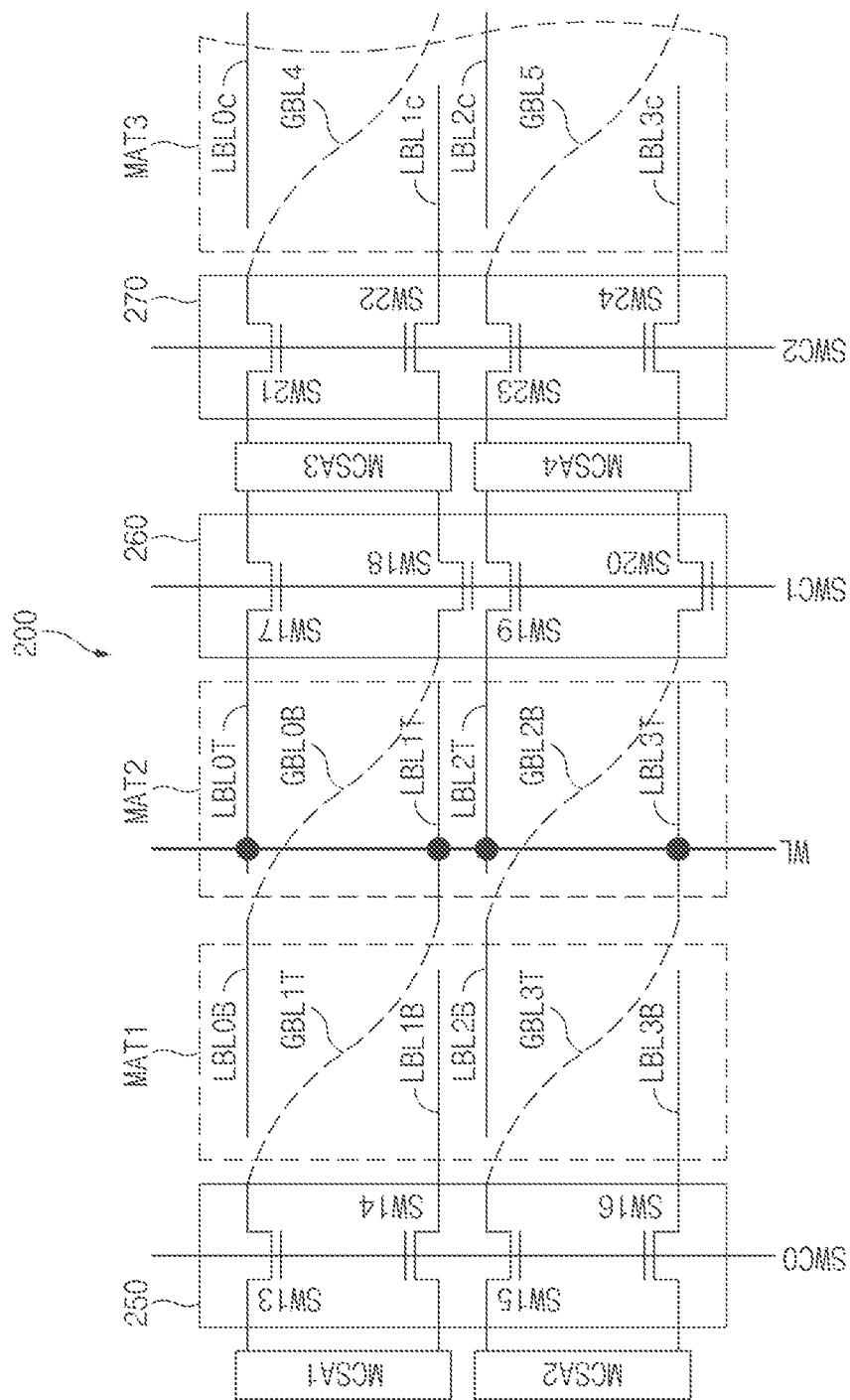
FIGS. 16 and 17 are schematic views illustrating a representation of an example of a semiconductor device according to still another embodiment of the present disclosure.

FIG. 16 is a schematic view illustrating a representation of an example of a semiconductor device according to another embodiment of the present disclosure.

Referring to FIG. 16, a semiconductor device 200 may include a plurality of mats MAT1~MAT3, a plurality of sense-amplifiers MCSA1~MCSA4, and a plurality of switching circuits 250~270.

The plurality of mats MAT1~MAT3 may be coupled to the plurality of sense-amplifiers MCSA1~MCSA4 through a local bit line and a global bit line. That is, the global bit line may be used to connect the respective local bit lines to the sense-amplifiers MCSA1~MCSA4.

The mat MAT1 may be coupled to the local bit lines LBL0B~LBL3B and the global bit lines GBL1T and GBL3T. The mat MAT2 may be coupled to the local bit lines LBL0T~LBL3T and the global bit lines GBL0B and GBL2B. The first mat MAT1 may be adjacent to the second mat MAT2. The mat MAT3 may be coupled to local bit lines LBL0c~LBL3c and the global bit lines GBL4 and GBL5.

In this case, the local bit lines LBL1B and LBL3B of the mat MAT1 may be respectively coupled to the sense-amplifiers MCSA1 and MCSA2 through the switching circuit 250. The local bit lines LBL0B and LBL2B of the mat MAT1 may be respectively coupled to the sense-amplifiers MCSA3 and MCSA4 through the global bit lines GBL0B and GBL2B. The global bit lines GBL1T and GBL3T may be located in the mat MAT1, and the global bit lines GBL0B and GBL2B may be located in the mat MAT2.

Therefore, the local bit lines LBL1B and LBL3B of the mat MAT1 may be respectively coupled to the contiguous sense-amplifiers MCSA1 and MCSA2. In contrast, the local bit lines LBL0B and LBL2B of the mat MAT1 may be respectively coupled to the sense-amplifiers MCSA3 and MCSA4 through the switching circuit 260 and the global bit lines GBL0B and GBL2B.

The local bit lines LBL0T and LBL0T of the mat MAT2 may be respectively coupled to the sense-amplifiers MCSA3 and MCSA4 through the switching circuit 260. The local bit lines LBL1T and LBL3T of the mat MAT2 may be respectively coupled to the sense-amplifiers MCSA1 and MCSA2 through the global bit lines GBL1T and GBL3T.

Therefore, the local bit lines LBL0T and LBL0T of the mat MAT2 may be respectively coupled to the contiguous sense-amplifiers MCSA3 and MCSA4. In contrast, the local bit lines LBL1T and LBL3T of the mat MAT2 may be respectively coupled to the sense-amplifiers MCSA1 and MCSA2 through the switching circuit 250 and the global bit lines GBL1T and GBL3T.

The switching circuit 250 may selectively control a connection between the mat MAT1 and the sense-amplifiers MCSA1 and MCSA2 in response to the switching signal SWC0. The switching circuit 250 may include a plurality of switching elements SW13~SW16. In this case, the switching elements SW13 and SW15 may selectively control connection of the sense-amplifiers MCSA1 and MCSA2 and the respective global bit lines GBL1T and GBL3T in response to the switching signal SWC0. The switching elements SW14 and SW16 may selectively control connection of the sense-amplifiers MCSA1 and MCSA2 and the respective local bit lines LBL1B and LBL3B in response to the switching signal SWC0.

The switching circuit 260 may selectively control connection between the mat MAT2 and the sense-amplifiers MCSA3 and MCSA4 in response to the switching signal SWC1. The switching circuit 260 may include a plurality of switching elements SW17~SW20. In this case, the switching elements SW17 and SW19 may selectively control connection of the sense-amplifiers MCSA3 and MCSA4 and the respective local bit lines LBL0T and LBL0T in response to the switching signal SWC1. The switching elements SW18 and SW20 may selectively control connection of the sense-amplifiers MCSA3 and MCSA4 and the respective global bit lines GBL0B and GBL0B in response to the switching signal SWC1.

In addition, the switching circuit 270 may selectively control a connection between the mat MAT3 and the sense-amplifiers MCSA3 and MCSA4 in response to the switching signal SWC2. The switching circuit 270 may include a plurality of switching elements SW21~SW24. In this case, the switching elements SW21 and SW23 may selectively control connection of the sense-amplifiers MCSA3 and MCSA4 and the respective global bit lines GBL4 and GBL5 in response to the switching signal SWC2. The switching elements SW22 and SW24 may selectively control connection of the sense-amplifiers MCSA3 and MCSA4 and the respective local bit lines LBL1C and LBL3C in response to the switching signal SWC2.

In the above-mentioned description, "T" may refer to a true bit line, and "B" may refer to a false bit line. For example, it is assumed that the word line WL of the mat MAT2 is activated. As a result, the switching signal SWC2 is activated, such that the sense-amplifiers MCSA3 and MCSA4 can operate.

The local bit lines LBL0T and LBL2T may be respectively coupled to the contiguous sense-amplifiers MCSA3 and MCSA4 through the switching circuit 260, such that the local bit lines LBL0T and LBL2T may operate as the true bit lines. The local bit lines LBL0B and LBL2B may be respectively coupled to the global bit lines GBL0B and GBL0B may operate as the false bit lines when the sense-amplifiers MCSA3 and MCSA4 are operated.

That is, a single sense-amplifier MCSA1 may operate for every two mats MAT1 and MAT2. From the viewpoint of the mat MAT2, the local bit lines LBL0T and LBL2T located in the mat MAT2 may operate as true bit lines, and local bit lines LBL0B and LBL2B located in the contiguous mat MAT1 may operate as false bit lines such that the mat MAT2 can operate as a reference.

FIG. 16 is a view illustrating an example of the open bit line structure to which a folded bit line sensing operation is applied. As can be seen from the embodiment of FIG. 16, because the bit line of the contiguous mat is used as a false bit line, an additional loading circuit 210 need not be used as compared to the example of FIG. 15.

Although the local bit line LBL0T of the mat MAT2 is independently coupled to the sense-amplifier MCSA3, the local bit line LBL0B of the mat MAT1 is coupled to the sense-amplifier MCSA3 through the global bit line GBL0B, such that it is not always necessary for all the gap regions between the mats to include a sense-amplifier. As a result, the number of sense-amplifiers is reduced such that the entire bank region can also be reduced in size.

Figure 17:
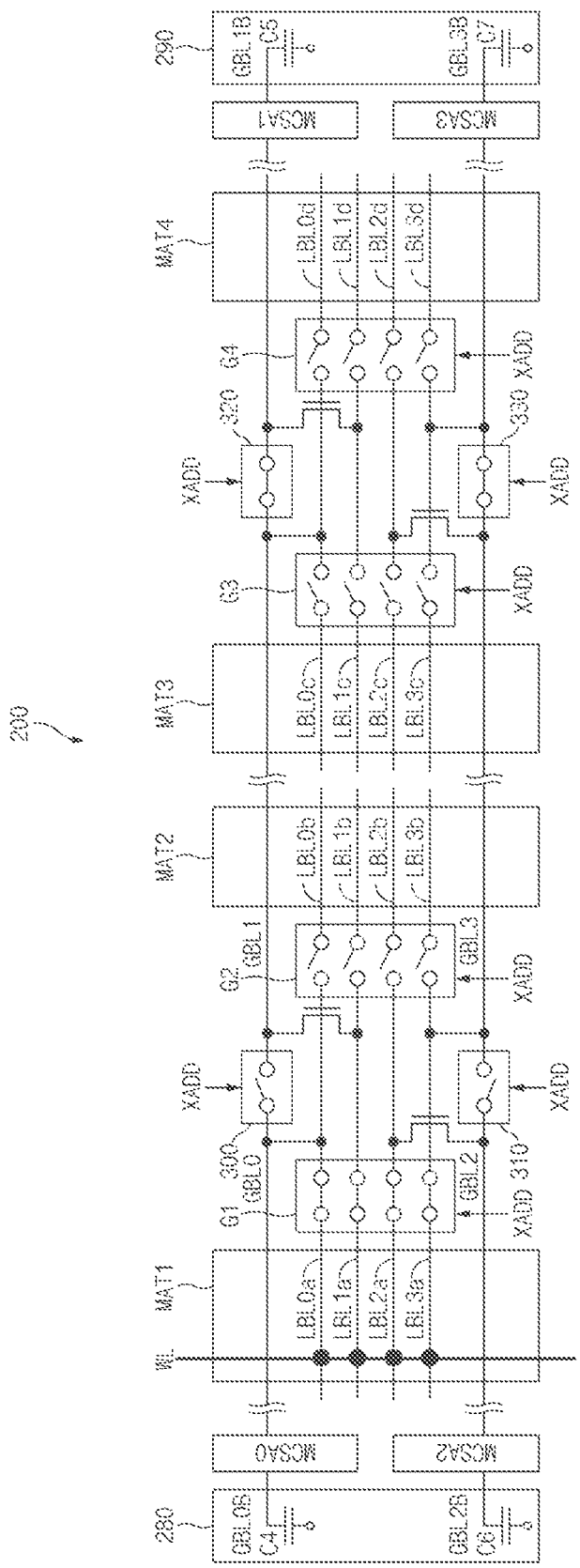

FIG. 17 is a schematic view illustrating a representation of an example of a semiconductor device according to another embodiment of the present disclosure.

Referring to FIG. 17, the semiconductor device 200 may include a plurality of mats MAT1~MAT4, a plurality of sense-amplifiers MCSA0~MCSA3, loading circuits 280 and 290, a plurality of switching circuits 300~330, and a plurality of switching groups G1~G4.

The plurality of mats MAT1~MAT4 may be coupled to the plurality of sense-amplifiers MCSA0~MCSA3 through a local bit line and a global bit line. That is, the mat MAT1 may be coupled to the local bit lines LBL0a~LBL3a and the global bit lines GBL0 and GBL2. The mat MAT2 may be coupled to the local bit lines LBL0b~LBL3b and the global bit lines GBL1 and GBL3. In addition, the mat MAT3 may be coupled to the local bit lines LBL0c~LBL3c and the global bit lines GBL1 and GBL3. In addition, the mat MAT4 may be coupled to the local bit lines LBL0d~LBL3d and the global bit lines GBL1 and GBL3.

The global bit lines GBL0 and GBL2 may be respectively coupled to the contiguous sense-amplifiers MCSA0 and MCSA2 through the mat MAT1. The global bit lines GBL1 and GBL3 may be respectively coupled to the sense-amplifiers MCSA1 and MCSA3 through the mats MAT2~MAT4. The sense-amplifiers MCSA0 and MCSA2 may be located in one edge region of the mat MAT1. The sense-amplifiers MCSA1 and MCSA3 may be located in one edge region of the mat MAT4.

The switching circuits 300 and 310 may be located in a gap region interposed between the mat MAT1 and the other mat MAT2. The switching circuit 300 may control connection between the global bit line GBL0 and the other global bit line GBL1 in response to a row address XADD including mat selection information. In addition, the switching circuit 310 may control connection between the global bit line GBL2 and the global bit line GBL3 in response to the row address XADD.

The switching circuits 320 and 330 may be located in a gap region interposed between the mat MAT3 and the other mat MAT4. The switching circuit 320 may control connection between the global bit line GBL1 of the mat MAT3 and the global bit line GBL1 of the mat MAT4 in response to the row address XADD. In addition, the switching circuit 330 may control connection between the global bit line GBL3 of the mat MAT3 and the global bit line GBL3 of the mat MAT4 in response to the row address XADD.

The plurality of switching groups G1~G4 may selectively control connection of the local bit lines and the global bit lines in response to the row address XADD. That is, the switching group G1 may control connection of the local bit lines LBL0a~LBL3a and the global bit lines GBL0~GBL3. The switching group G2 may control connection of the local bit lines LBL0b~LBL3b and the global bit lines GBL0~GBL3. The switching group G3 may control connection of the local bit lines LBL0c~LBL3c and the global bit lines GBL0~GBL3. In addition, the switching group G4 may control connection of the local bit lines LBL0d~LBL3d and the global bit lines GBL0~GBL3.

The loading circuit 280 may provide a reference voltage during operation of the sense-amplifiers MCSA0 and MCSA2. The loading circuit 280 may include a capacitor C4 coupled to the sense-amplifier MCSA0 and a capacitor C6 coupled to the sense-amplifier MCSA2.

If the global bit line GBL0 of the mat MAT1 is selected, the reference line GBL0B coupled to the capacitor C4 may operate. In addition, if the global bit line GBL2 of the mat MAT1 is selected, the reference line GBL0B coupled to the capacitor C6 may operate.

In addition, the loading circuit 290 may provide a reference voltage during operation of the sense-amplifiers MCSA1 and MCSA3. The loading circuit 290 may include a capacitor C5 coupled to the sense-amplifier MCSA1 and a capacitor C7 coupled to the sense-amplifier MCSA3.

If the global bit lines GBL1 of the mats MAT2~MAT4 are selected, the reference line GBL1B coupled to the capacitor C5 may operate. If the global bit lines GBL3 of the mats MAT2~MAT4 are selected, the reference line GBL3B coupled to the capacitor C7 may operate.

As can be seen from the embodiment of FIG. 17, the sense-amplifier is not always located in all the gap regions disposed between the mats MAT1~MAT4, the sense-amplifiers MCSA0 and MCSA2 are located in an edge region of the first mat MAT1, and the sense-amplifiers MCSA1 and MCSA3 are located in an edge region of the last mat MAT4. In addition, only the switching circuits 300~330 may be located in the gap regions interposed between the plurality of mats MAT1~MAT4.

For example, it is assumed that the word line WL of the mat MAT1 is activated. If the mat MAT1 corresponding to the row address XADD is selected, only the switching group G1 corresponding to the selected mat MAT1 from among the plurality of switching groups G1~G4 is turned on, and the remaining switching groups G2~G4 are turned off. That is, the switching group G1 adjacent to the mat MAT1 is coupled to the switching circuits 300 and 310, and the remaining switching groups G2~G4 and the remaining switching circuits 320 and 330 are cut off.

A detailed description of the connection path between the bit lines according to a connection or a cut-off state of the switching circuits 300~330 and the switching groups G1~G4 is as follows. If the word line WL is activated, the local bit lines LBL0a~LBL3a of the corresponding mat may be coupled to the global bit lines GBL0~GBL3 through the switching group G1 adjacent to the mat MAT1.

The global bit line GBL0 may be coupled to the local bit line LBL0a, the sense-amplifier MCSA0, and the reference line GBL0B. The global bit line GBL1 may be coupled to the local bit line LBL1a, the sense-amplifier MCSA1, and the reference line GBL1B. The global bit line GBL2 may be coupled to the local bit line LBL2a, the sense-amplifier MCSA2, and the reference line GBL0B. The global bit line GBL3 may be coupled to the local bit line LBL3a, the sense-amplifier MCSA3, and the reference line GBL3B.

The local bit lines LBL0a~LBL3a contained in the mat MAT1 may be coupled as true bit lines to the corresponding sense-amplifiers MCSA0~MCSA3. In addition, the capacitors C4~C7 of the loading circuits 280 and 290 located adjacent to the sense-amplifiers MCSA0~MCSA3 may operate as a reference bit line.

The above-mentioned description has disclosed a detailed explanation of embodiments of the present disclosure. For reference, the embodiments may include additional structures for better understanding of the present disclosure as necessary although the additional structures are not directly associated with technical ideas of the present disclosure. In addition, the Active High or Active Low constructions for indicating deactivation states of a signal and circuit may be changed according to the embodiment.

In order to implement the same function, a transistor structure may be modified as necessary. That is, the PMOS transistor and the NMOS transistor may be replaced with each other as necessary, and may be implemented using various transistors as necessary. In order to implement the same function, a structure of a logic gate may be modified as necessary. The above-mentioned circuit modification may be very frequently generated, such that a very high number of cases may exist and associated modification can be easily appreciated by those skilled in the art, and as such a detailed description thereof will herein be omitted for convenience of description.

As is apparent from the above description, the semiconductor device according to embodiments of the present disclosure can stabilize a bit-line precharge voltage by adjusting a level of a pull-down power-supply line prior to operation of a sense-amplifier, resulting in reduction of a chip size of the semiconductor device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
a plurality of sense amplifiers, each of which performs a sensing operation of the pair of sensing bit lines if the pair of bit lines is separated from the pair of sensing bit lines within a pre-sensing period;
a plurality of mats, each of which includes a plurality of local bit lines and a plurality of global bit lines;
a plurality of switching circuits located in gap regions interposed between the plurality of mats, and configured to selectively interconnect the plurality of global bit lines in response to a row address having mat selection information;
a plurality of switching groups located to correspond to the plurality of mats, and configured to selectively control connection of the plurality of local bit lines and the plurality of global bit lines; and
a loading circuit located in both edge regions of the plurality of mats, and configured to correct loading of a contiguous sense-amplifier.

2. The semiconductor according to claim 1, wherein the plurality of sense amplifiers are located in both edge regions of the plurality of mats.

3. The semiconductor device according to claim 1, wherein:
if any one of the plurality of mats is selected, only a switching circuit and a switching group located adjacent to the selected mat are turned on, and the remaining switching circuits and the remaining switching groups are turned off.

4. The semiconductor device according to claim 1, wherein:
if the first mat from among the plurality of mats is selected,
some parts of the local bit lines of the first mat are coupled to a sense-amplifier adjacent to the first mat through a global bit line of a first group, and the remaining parts other than the some parts are coupled to a sense-amplifier adjacent to a second mat through a global bit line of a second group.

5. A semiconductor device comprising:
a plurality of mats, each of which includes a plurality of local bit lines and a plurality of global bit lines;
a plurality of sense-amplifiers located in both edge regions of the plurality of mats;
a plurality of switching circuits located in gap regions interposed between the plurality of mats, and configured to selectively interconnect the plurality of global bit lines in response to a row address having mat selection information;
a plurality of switching groups located to correspond to the plurality of mats, and configured to selectively control connection of the plurality of local bit lines and the plurality of global bit lines; and
a loading circuit located in both edge regions of the plurality of mats, and configured to correct loading of a contiguous sense-amplifier.

6. The semiconductor device according to claim 5, wherein:
if any one of the plurality of mats is selected, only a switching circuit and a switching group located adjacent to the selected mat are turned on, and the remaining switching circuits and the remaining switching groups are turned off.

7. The semiconductor device according to claim 5, wherein:
if the first mat from among the plurality of mats is selected,
some parts of the local bit lines of the first mat are coupled to a sense-amplifier adjacent to the first mat through a global bit line of a first group, and the remaining parts other than the some parts are coupled to a sense-amplifier adjacent to a second mat through a global bit line of a second group.

8. The semiconductor device according to claim 5, wherein:
the plurality of sense-amplifiers selectively controls connection between a pair of bit lines and a pair of sensing bit lines in response to a connection control signal within an offset compensation period, and precharges a pull-down power-supply line with a bit line precharge voltage level within the offset compensation period; and
a pull-down voltage controller configured to increase a voltage of the pull-down power-supply line by a predetermined level in response to a pull-down control signal within the offset compensation period.

* * * * *